United States Patent [19]

Walls

[11] Patent Number: 5,172,064

[45] Date of Patent: Dec. 15, 1992

[54] CALIBRATION SYSTEM FOR DETERMINING THE ACCURACY OF PHASE MODULATION AND AMPLITUDE MODULATION NOISE MEASUREMENT APPARATUS

[75] Inventor: Fred L. Walls, Boulder, Colo.

[73] Assignee: The United States of America as represented by the Secretary of Commerce, Washington, D.C.

[21] Appl. No.: 801,560

[22] Filed: Dec. 2, 1991

[51] Int. Cl.⁵ .......................................... G01R 27/00
[52] U.S. Cl. .................................. 324/601; 324/603; 324/613; 324/614
[58] Field of Search .............. 371/28; 379/6, 24; 455/226.3, 296, 310, 63; 324/301, 303, 613, 614

[56] References Cited

U.S. PATENT DOCUMENTS

| | | |
|---|---|---|
| 2,777,953 | 1/1957 | Tollefson . |
| 3,104,354 | 9/1963 | Weinschel et al. . |
| 3,586,993 | 6/1971 | Buck . |
| 3,731,186 | 5/1973 | Sadel . |
| 3,890,470 | 6/1975 | Allen . |
| 3,970,795 | 7/1976 | Allen . |
| 4,034,285 | 7/1977 | Ashley et al. . |
| 4,118,665 | 10/1978 | Reinhardt . |
| 4,475,090 | 10/1984 | Stern . |
| 4,630,217 | 12/1986 | Smith et al. . |
| 4,634,962 | 6/1987 | Banura et al. . |
| 4,714,873 | 12/1987 | McPherson et al. . |
| 4,742,561 | 5/1988 | Tipton .................................. 455/67 |
| 4,806,845 | 2/1989 | Nakano et al. . |

Primary Examiner—Kenneth A. Wieder
Assistant Examiner—Jose M. Solis
Attorney, Agent, or Firm—Robert G. Lev

[57] ABSTRACT

An apparatus and a method for determining the error due to inherent PM and AM noise in a noise measurement device. The apparatus is a calibration standard having a high frequency carrier source and a Gaussian noise source. The outputs of both sources are linearly combined by a power summer so that AM and PM noise components are equal at the output terminals of the calibration standard. To carry out the process of calibrating the calibration standard then determining inherent noise in a noise measuring device under test, the calibration standard includes means for switching to output a signal indicative of either the noise floor or a high frequency signal linearly combined with the output of a Gaussian noise source.

10 Claims, 9 Drawing Sheets

CALIBRATION SYSTEM FOR DETERMINING THE ACCURACY OF PHASE MODULATION AND AMPLITUDE MODULATION NOISE MEASUREMENT APPARATUS

TECHNICAL FIELD

This invention relates to systems for phase modulation and amplitude modulation noise measurement. More particularly, this invention relates to a calibration standard for determining the internal noise and the accuracy of PM and AM measurement equipment and devices.

BACKGROUND ART

The ability of communication, navigation and a wide variety of frequency and timing measurement equipment to perform properly is determined in part by their phase noise performance. A common aspect of their design, manufacture, calibration, and ultimate use is phase modulation (PM) noise introduced by such equipment. While other performance parameters are certainly present and important, they are often relatively more simple to predict, calibrate and control than phase modulation noise performance. There are a variety of systems for measuring phase modulation noise, and these are discussed in the publications listed in the attached Appendix, incorporated herein by reference.

Currently, the most accurate method of measuring phase modulation noise is a system that includes a precision wide band phase modulator inserted in series with a signal whose PM noise is to be measured. The modulator is used to create phase modulation side bands about the carrier of the signal for determining the corrections to the measurement as a function of Fourier frequency offset from the carrier. The result is high accuracy and wide bandwidth of PM noise measurements. This system is disclosed in U.S. Pat. No. 4,968,908 (listed as No. 10 in the attached Appendix.

The output waveform of PM. noise is defined in the first publication listed in the Appendix. The amplitude fluctuations are contained in the term $\epsilon(t)$ and the phase or frequency fluctuations are contained in the term $\phi(t)$. Variations in the $\phi(t)$ value result in unequal spacing of the zero crossings of the waveform, while variations in the $\epsilon(t)$ value result in variations of the height of the peaks. Phase modulation noise is often defined by $S_\phi(f)$, which is a spectral density of phase fluctuations. The derivation of this term is found in the first four articles listed in the Appendix and can be expressed as:

$$S_\phi(f) = \delta\phi^2(f)/BW \text{ units radians}^2/Hz \qquad (1)$$

where $\delta\phi^2(f)$ is the mean squared phase fluctuation measured at a frequency separation f from the carrier is a bandwidth BW.

Similarly, the practical definition for the spectral density of amplitude modulation noise is:

$$S_a(f) = \delta V^2(f)/((V_o^2)BW) \text{ units } 1/Hz \qquad (2)$$

where $\delta V_o^2(f)$ is the mean squared voltage fluctuation measured at a frequency separation f from the carrier in a bandwidth BW.

Although the subject system provides the basis for new high performance wide band PM noise measurement systems, it does not provide a direct way to verify the performance of already existing PM noise measurement systems. Nor does it address the accuracy of amplitude modulation (AM) noise measurements. AM noise is very important in specifying the realized PM noise performance due to AM to PM conversion which is present in virtually all systems. The specification of PM (and recently AM) noise is required for most sources requiring high levels of precision. There is also a demand for noise measurement systems which can be traceable to their primary calibration laboratory. To achieve traceability, it seems necessary to have a PM noise calibration standard that is small, portable, rugged, and has high accuracy and repeatability. Such a standard should measure the noise floor of the system and the accuracy of measuring a known level of PM noise over wide bandwidths.

Presently available noise sources have no carrier associated with them and so are not suitable for use as either AM or PM noise standards. The present way in which measurements are now verified is for several laboratories to measure the noise of a commercial oscillator. This is not very satisfactory because the PM and AM noise levels are generally a function of their environment (also running time) and therefore subject to change. This arrangement is cumbersome, expensive and time consuming.

DISCLOSURE OF THE INVENTION

Accordingly, it is an objective of the present invention to determine the accuracy of existing PM and AM noise measurement devices within a tolerance of ±0.3 dB.

A further objective of the invention is to provide a calibration standard for determining both PM and AM noise correction factors in noise measurement devices.

Yet another objective is evaluation of time-domain measurement equipment.

Still another objective is the development of a method of calibrating a noise standard to compensate for internal noise.

An additional objective is the development of a method of determining the internal PM noise of a noise measurement device.

Yet a further objective is the development of a method of determining the internal AM noise of a variety of AM noise detector configurations.

According to the present invention, a calibration standard for determining inherent phase modulation and amplitude modulation noise of an associated noise measurement device includes means for generating high frequency signals and means for generating precision broad band noise. The output of the calibration standard includes dual output terminals for connecting a differential output to an associated noise measurement device. Power summer means combine one output of the power splitter means and one output of the noise generating means. Means for selectively switching are operatively connected between the noise generating means and the power summer means to selectively provide two noise levels to the associated noise measurement device connected to the dual output terminals.

In accordance with another aspect of the invention, the calibration standard includes means for generating high frequency signals, noise generating means and dual differential output terminals for connecting to an associated noise measurement device. The power splitter means provides high frequency signals to both output terminals. A power splitter means, power summer means and means for switching are also included in the calibration standard. These components are arranged so that noise from the generating means linearly is added to the output of the high frequency generating means by the power summer means. Phase modulation and amplitude modulation noise are equal to each other at one of the dual differential output terminals. As a result the spectral density of differential phase modulation noise and the spectral density of differential amplitude modulation noise between the dual output terminals are equal.

Another embodiment of the invention includes a method for deriving a correction factor for AM/PM noise measurement systems being tested by a calibration standard. In the first step, a high frequency signal is generated by the calibration standard to produce a measurable noise floor for the calibration standard. Next a calibration standard generates a high frequency signal and a Gaussian noise signal which are combined in a power summer to measure the combined noise of the calibration standard wherein both the PM and AM noise components are found to be equal at the differential output of the calibration standard. A spectral density of noise from the calibration standard is derived from the combined noise and the floor noise of a calibration standard. The calibration standard is then connected to a noise measurement system to be tested, thereby forming a combined system between the two devices. The floor noise of the combined system is measured by generating high frequency signal in the calibration standard. Next a high frequency signal and a Gaussian noise signal are combined in the power summer of the calibration standard to measure the combined noise of the combined system. Using the combined noise and the floor noise of the combined system, a spectral density of noise for the combined system is determined. By comparing the spectral density of noise of both the calibration standard and the combined system, a correction factor for the noise measurement system being tested is derived.

BEST MODE FOR CARRYING OUT THE INVENTION

Figure 1:
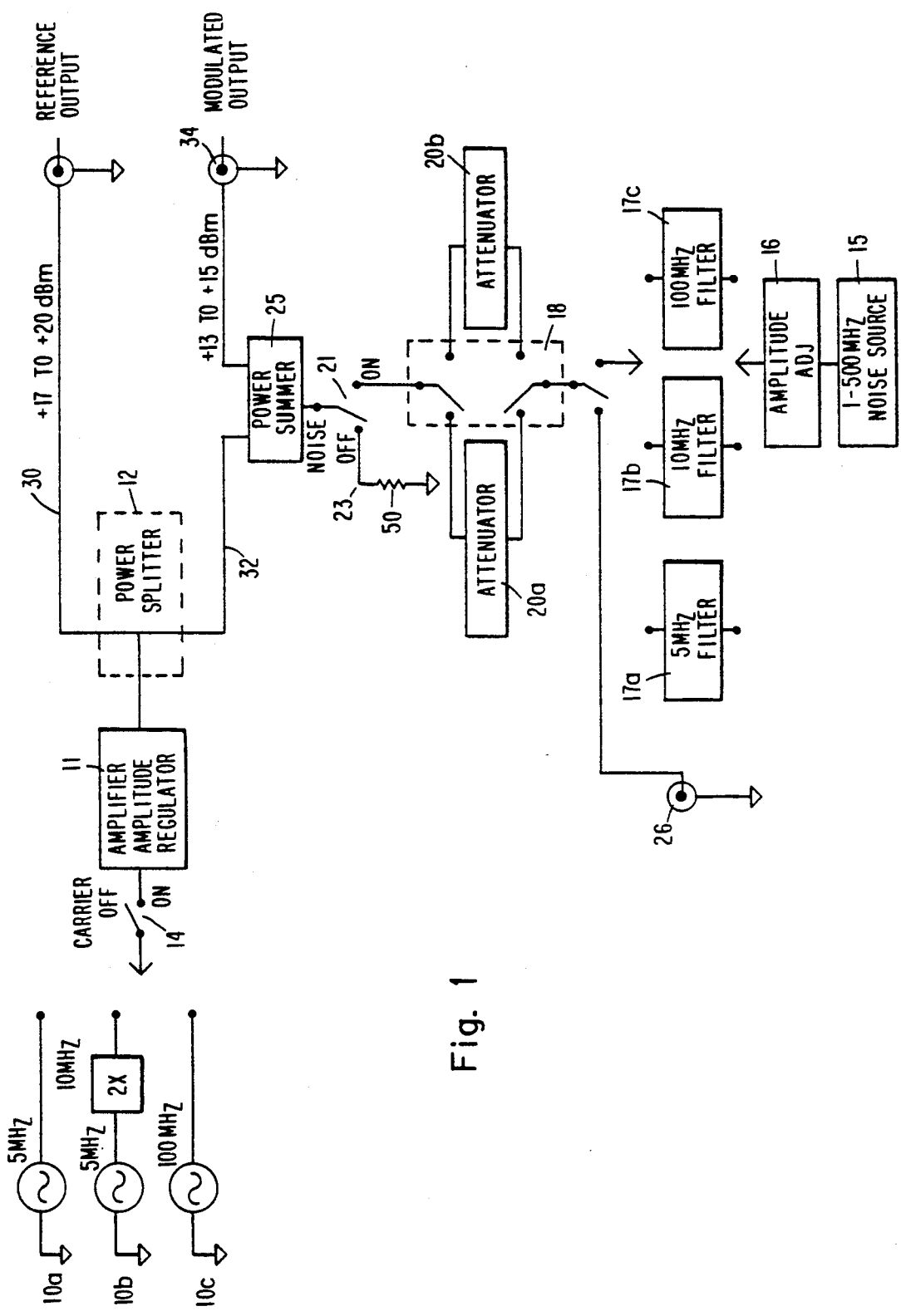
FIG. 1 is a block diagram of a calibration standard for PM and AM noise.

FIG. 1 shows a block diagram of the calibration standard of the present invention. A frequency source 10 with very low residual PM and AM noise is preferably composed of a plurality of high frequency generators 10a, 10b, 10c. The plurality of high frequency generators are selectively switched on and off and regulated in amplitude by regulator 11. The output of regulator 11 is divided into two signals using a passive power splitter or directional coupler 12. A passive power splitter is used since active power splitters generally add more AM and PM noise than passive ones. Switch 14 is used to connect the high frequency carrier signal to the regulator and then to the power splitter. The phase of the two signals output from the power splitter track one another with considerable fidelity. If necessary, the phase between these two signals can be adjusted using phase shifter 31.

As discussed in publications 5 and 6 of the attached Appendix, the differential PM noise between signals is typically smaller than the resolution of available measurement systems. Consequently, the PM noise of the driving source is effectively cancelled out. The signal generators shown in FIG. 1 are 5 MHz, 10 MHz and 100 MHz, and experiment use has been from 5 MHz to 10.0 GHz. However, sources from audio frequencies to the visible light region can be used, with appropriate modifications in the regulator, power splitter and precision Gaussian noise source 15.

The Gaussian noise source is a precision broad band source adjusted in amplitude by amplifier 16. The output of amplifier 16 is filtered by pass band filter 17. Ideally, noise source 15 is chosen to be very flat over the Fourier frequency range of interest around the carrier frequency of the high frequency source 10. Also, noise source 15 will ideally be independent of temperature. Amplifier 16 can be configured to hold its output low constant independent of temperature using techniques well know to the art.

Switch 18 is used to change the level of noise by inserting known attenuators 20A and 20B into the output of pass band filter 17. Preferably pass band filter 17 will be composed of a plurality of filters 17a, 17b, 17c which can be selected according to the high frequency source 10a, 10b, 10c selected.

Switch 21 is used to connect either a 50 ohm termination 23 connected to ground, or the output of switch 18 (from noise source 15) to a summing device 25. Element 25 sums the noise from either the 50 ohm grounded resistor, or the adjusted noise source with the signal from line 32 to produce the modulated signal at output terminal 34.

The power summer linearly adds the noise source 15 signal with signal 32 from the power splitter 12. The signal from the noise source is arranged to have nearly constant power spectral density from approximately 10% below the carrier signal to 10% above the carrier signal. If a PM or a AM modulator were used in place of the power summer, the noise source would have to have a constant power spectral density from dc to 10% of the carrier. It is much easier to build a source that is constant over approximately a 20% range of bandwidth than one that is constant over many orders of magnitude. As a result, it is cheaper to use a power summer for a small number of frequencies. Further, the flatness of the noise spectrum is much better with a power summer than with a phase modulator. A power summer is more accurate than a phase modulator but needs a different modulation source for each carrier. (In this case, a separate filter and a broad band noise source.) The critical feature of the power summer as opposed to a phase modulator is that with the power summer both PM and AM noise of exactly equal amplitude are obtained. In contrast, with a phase modulator only PM noise is obtained. The resulting PM noise and AM noise at one of the output terminals and the equal spectral densities of both PM and AM noise across the differential output terminals of the calibration standard are critical to the operation of the calibration standard.

The dual differential output terminals of the calibration standard produces two signals with exceptionally low differential PM and AM noise between them. The level of $S_\phi(f)$ (as defined in equation 1) is constant from DC to approximate one-half of the bandwidth of the filter 17. The present invention also produces a spectral density of fractional AM noise, $S_a(f)$ (as defined in equation 2) which is numerically equal to $S_\phi(f)$ for the same range of analysis frequencies about the carrier generated by high frequency generator 10 (publications 4-7 listed in the Appendix describe the spectral density of fractional AM noise). These noise spectrums can be made extremely constant over a wide temperature range by stabilizing the level of the carrier generated by 10 and the noise generated by 15 using well known techniques.

The level of added noise from source 15 is such that:

$$\int_0^\infty S_\phi(f)df < < 0.1 \text{ rad}^2/\text{hz}. \qquad (3)$$

This ensures that the compression of the measured $S_0(f)$ is smaller than 0.04 dB. The differential PM noise between the two signals are generally much smaller than the PM noise of the source. The ratio of the differential PM noise to the source PM noise can approach $-100$ dB at low Fourier frequencies, degrading the two approximately $-16$ dB at $f=\gamma_0/10$ (where $\gamma_0$ is the carrier frequency). This condition improves the accuracy of the PM standard, especially at low Fourier frequencies or the PM noise of the source 10 becomes important.

Since AM noises generally measured on a single channel, the differential technique applied to determining $S_\phi(f)$ is of no aid in extending the range in which the AM noise can be measured. The AM noise of the signal contains both the originally AM noise of the source (after regulation by 11) and the calibrated AM noise. As a consequence, one might expect that the spectrum of $S_a(f)$ at the output derives much faster than the PM noise as a Fourier frequency f approaches 0. However, most sources have much lower AM noise than PM noise close to the carrier. This condition helps alleviate the potential problem of diminished AM noise measurement range.

Since there is no phase coherence between the signal and the noise, the resulting signal 34 has precisely equal AM and PM noise within the limits defined by equation 3. (This assumes negligible amplitude compression in the power summer 25.) These conditions can be obtained without extraordinary requirements of the components included in the calibration standard.

Calibration of the calibration standard can be done with very high accuracy if it is used with an instrument that can make relative power measurements at frequencies near that of the carrier. This instrument is scanned to measure $V_n^2/\text{HZ}$ (power spectral density) at terminal 34 in the absence of the carrier generated by generating means 10 as a function of separation f from the frequency of the carrier (having a value $\gamma_0$). Next, the power in the carrier generated by generating means 10 is measured in the absence of the noise generated by noise source 15. The band width of the receiver is then measured, and from these measurements, $S_\phi(f)$ and $S_a(f)$ can be calculated. It is important to note that only the relative power levels are required, not the absolute power level. Therefore, the measurement does not depend on the internal calibration of absolute power level in the instrument. The ability to measure the noise level and the carrier level separately is critical since it allows the instrument to operate with the highest accuracy for each measurement.

The components selected in the calibration operation are chosen to minimize the voltage standing wave ratio so that changing the state of switches 14, 18 or 21 does not significantly alter the impedance, or phase of the output to the associated noise measurement system. Changing the attenuation from 20A to 20B changes the level of the noise $V_n^2$ and thereby changes $S_\phi(f)$ by the difference in the attenuation between 20A and 20B. Attenuators 20A and 20B are calibrated using the noise source 15 through the external port 26.

It is necessary for this system that the phase detector and the PM noise measurement system 200 associated with the calibration standard has sufficient discrimination against AM noise and that the amplitude detector and the AM noise measurement system has sufficient discrimination against PM noise. It is noted that 15 dB of discrimination reduces the unwanted effects of below 0.13 dB. This level of discrimination is easily met by virtually all AM and PM noise measurement systems in use. Consequently, the present invention can be facilitated without the use of extraordinary components. When calibrating the calibration standard, only the equivalent noise band of the receiver (BW) and its accuracy for relative measurements over the range from $V_0^2$ to $(V_n^2/\text{Hz})$ BW must be calibrated to determined $S_\phi(f)$. The form of equation 1 is such that small errors in the alignment of filter 17 resulting in odd order variations of $V_n^2$ ($\nu$) about $\nu_0$ are averaged away. The only limit of setting the level of $S_\phi(f)$ is that it should be high enough that it is far (15 dB margin reduces the airs to approximately 0.13 dB) above the noise floor of the measured system (as measured without the noise generated by source 15), and yet small enough to satisfy the requirements of equation 3. The smaller the desired band width for $S_\phi(f)$, the high the level of $S_\phi(f)$ in amplitude can be made and still not violate equation 3. Normally, $S_\phi(f)$ is selected to be constant for f larger than 0 but, less than the smaller of $\nu_0/10$ or 1 GHz, and the integrated phase noise in the range from $10^{-2}$ to $10^{-4}$ rad$^2$. It is also necessary that all the amplifiers used in the evaluation of $S_\phi(f)$ be operated in the linear gain region.

Figure 2:
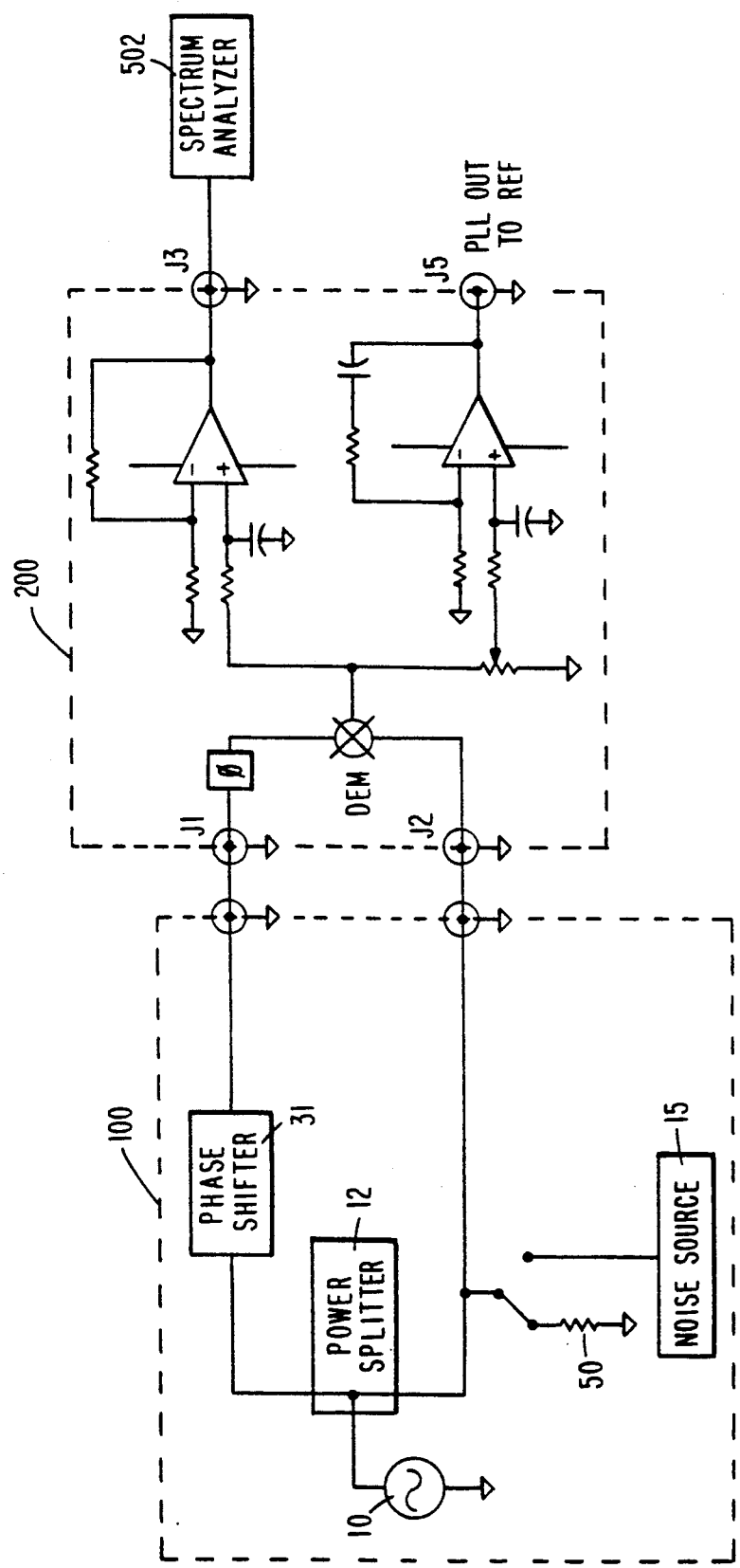
FIG. 2 is a block diagram showing the preferred connection between the calibration standard and a phase noise measurement system under test, for measuring the phase noise between two parts.

Once $S_\phi(f)$ is determined for the calibration standard, a second similar measurement is made with respect to the associated noise measurement device being tested. The signal input of the PM noise measurement system to be measured 200, is connected to the outputs 30 and 34 of the PM/AM noise standard as depicted in FIG. 2. This arrangement requires that the phase noise measurement system be able to adjust the phase between the two signals at terminals 30 and 34 to bring about a 90° phase shift between the two signals at the phase detector so that output is closed to 0 volts. Not all commercial units have this phase adjusting capability, so it may be necessary to use an external phase shifter on one of the inputs, or to use phase sifter 31 within the PM/AM noise standard. The phase noise as determined by the measurement system is $$S\phi(f) = (V_n(f)^2/BW)(1/k_d(f))^2, \text{ units rad}^2/\text{Hz} \qquad (4)$$

where $V_n(f)^2/BW$ is the spectral density of voltage noise measured by the spectrum analyzer 501, and $k_d(f)$ is the sensitivity of the phase detector for converting phase fluctuations to voltage fluctuations (including any gain that may be associated with it). The units of $k_d$ are radians/volt. $k_d$ is a function of the carrier frequency, the impedance level, drive level of both signals, and even on the cable lengths between the outputs of the PM/AM standard and the measurement system. Typically, $k_d$ is determined using the beat frequency method and an external source.

The noise floor of the measurement system is determined with switch 21 connected to the grounded 50 ohm resistor and the calibrated PM noise of the standard is measured with the switch 21 connected to receive the output from noise source 15. Using these values and the bandwidth of the receiver (noise measurement apparatus under test) which has already been measured, a second value of $S_\phi(f)$ is determined. The difference is the level between the two $S_\phi(f)$ values represent the error in the PM noise measurement for the noise measuring apparatus being tested. Consequently, a correction factor can be derived. It is noted that the contribution of the noise floor of the PM noise measurement apparatus generally needs to be taken into consideration only when the Fourier frequency approaches 0, i.e., is near the carrier frequency, as discussed in publication 6 listed in the Appendix.

Figure 3:
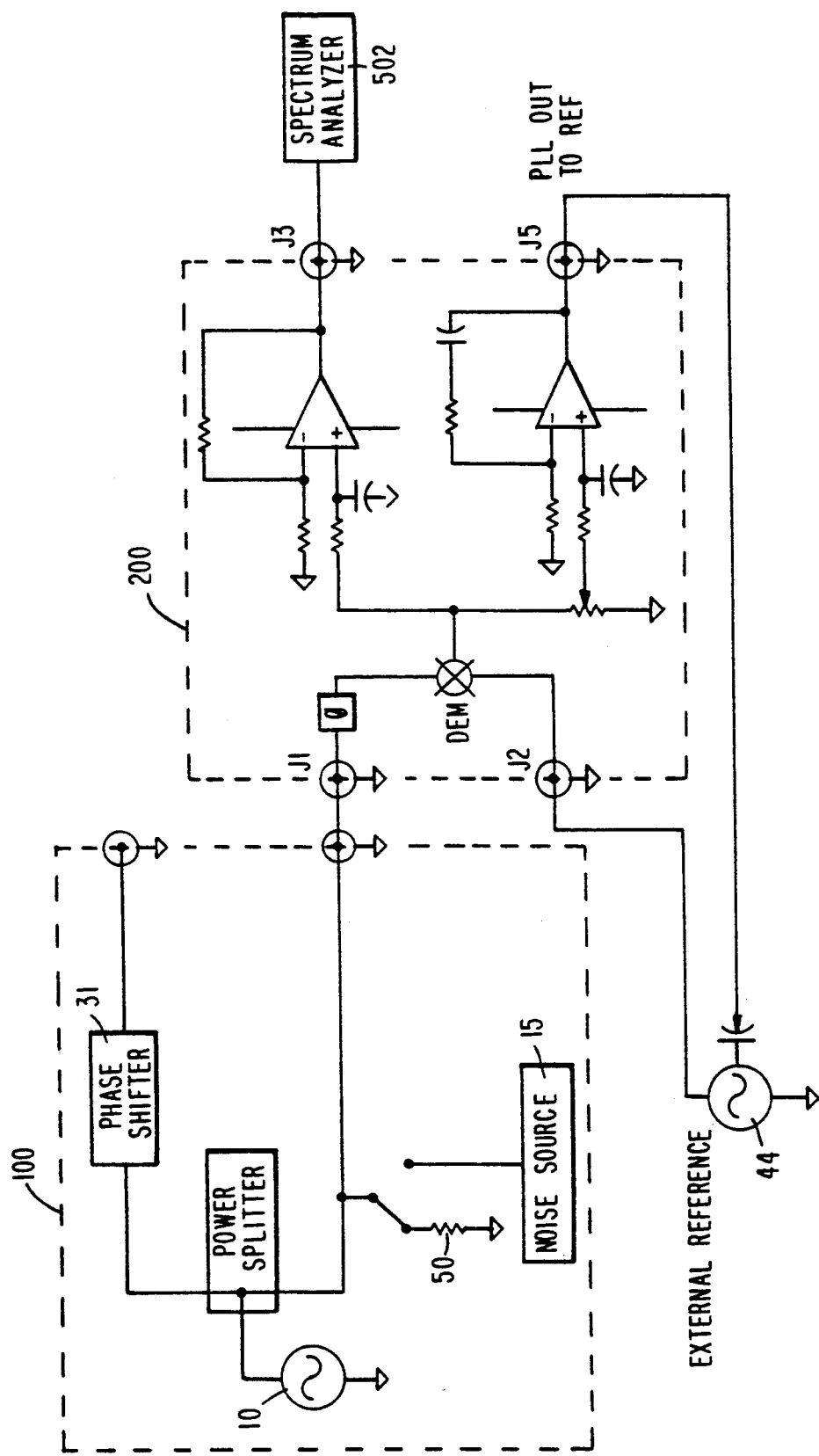
FIG. 3 is a block diagram illustrating a calibration standard connected to a phase noise measurement system under test using an external reference oscillator to facilitate signal phase adjustment.

FIG. 3 is a block diagram illustrating an arrangement in which a phase shifter is not included in the calibration standard or the phase noise measurement system under test. Rather, an additional external oscillator is used to adjust the phase of the signal. The PM noise of both oscillators, as well as the calibrated PM noise, are detected in the measurement. This approach can also lead to very accurate measurements if the oscillator PM noise is small enough. The calibration standard of the present invention accommodates this approach by providing oscillators with very low residual AM and PM noise, and the ability to turn the calibrated PM noise off, using switch 21, to check the noise floor of both the calibration standard and the phase noise measurement system.

As in the arrangement of FIG. 2, the measurement sequence is to measure the residual PM noise when the calibrated PM noise generated by source 15 is off, and then to measure the PM noise with the calibrated PM noise from source 15 added to the output. From these two measurements, the contributions of the uncancelled PM noise of the oscillators and the measurement system and their contribution to the measurement of the PM noise standard can be determined. Unlike the measurement technique of FIG. 2, it is not generally possible to verify the noise floor of the noise measurement apparatus because the phase noise of the reference oscillators always contribute to the measured noise level.

Figure 4:
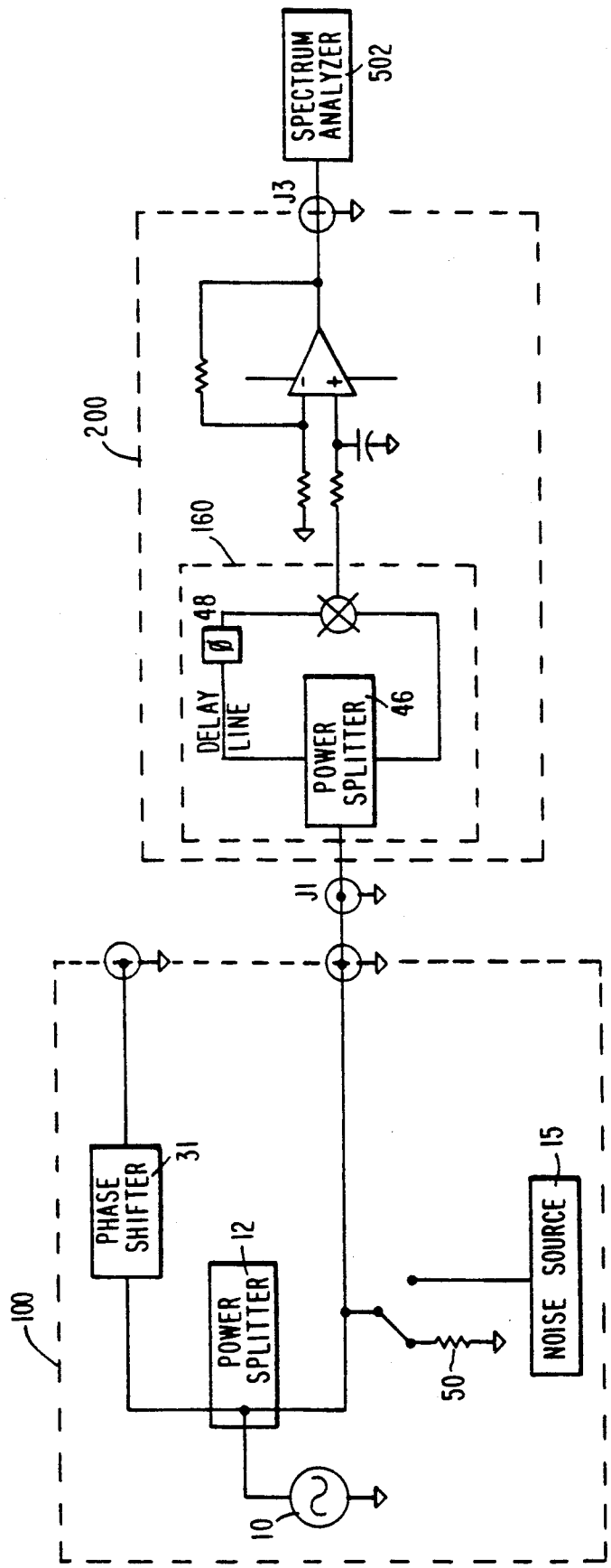
FIG. 4 is a block diagram illustrating the calibration standard of the present invention connected to a phase noise measurement system under test using a delay line to provide signal phase adjustments.

The calibration standard of the present invention can also be used to calibrate the accuracy of single oscillator phase noise measurement systems such as that shown in FIG. 4. The PM noise of both the oscillator 10 and the noise in the single oscillator measurement system 500 are detected in the same measurement. This approach can lead to accurate measurements if the oscillator 10 PM noise is small enough, as described in publication 6 of the attached Appendix. The calibration standard accommodates this approach by providing oscillators with very low residual AM and PM noise, and the ability to turn the calibrated PM noise off by using switch 21 in order to measure the floor noise. As previously described, the measurement sequence is used to determine the residual PM noise of the measuring apparatus when the calibrated PM noise from source 15 is disconnected, and then to measure the PM noise with the calibrated noise from source 15 added to the output of the standard. From these two measurements, the contributions of the uncancelled PM noise of the oscillator and the measurement system and their contribution to the measurement of the PM noise standard can be determined. Using the arrangement of FIG. 4, it is generally not possible to verify the noise floor of the noise measurement system because the phase noise of the reference oscillators always contribute to the measured noise level.

The AM noise of the calibration standard is determined in the same way as the PM noise of the calibration standard.

First the noise floor is determined. Then a carrier is combined with calibrated noise from source 15 $S_\phi(f) = S_a(f)$ in the noise standard due to the presence of the power summer 25. Consequently:

$$S_a(f) = S_\phi(f) = \frac{(V_N^2(\nu_0 - f)/\text{Hz} + V_N^2(\nu_0 + f)/\text{Hz}}{V_0^2} \qquad (5)$$

Amplitude modulation noise can be measured by a number of different methods. All of them are characterized by a detector that converts the amplitude of the rf carrier signal to a dc voltage. The definition for $S_a(f)$ is given in Equation 2.

The most uncertain part of the process is determining the sensitivity of the detector for converting the carrier amplitude to a dc voltage, since the detector sensitivity, $k_a$, is a function of $V_o$, f, and the carrier frequency, $\nu_o$.

Figure 5:
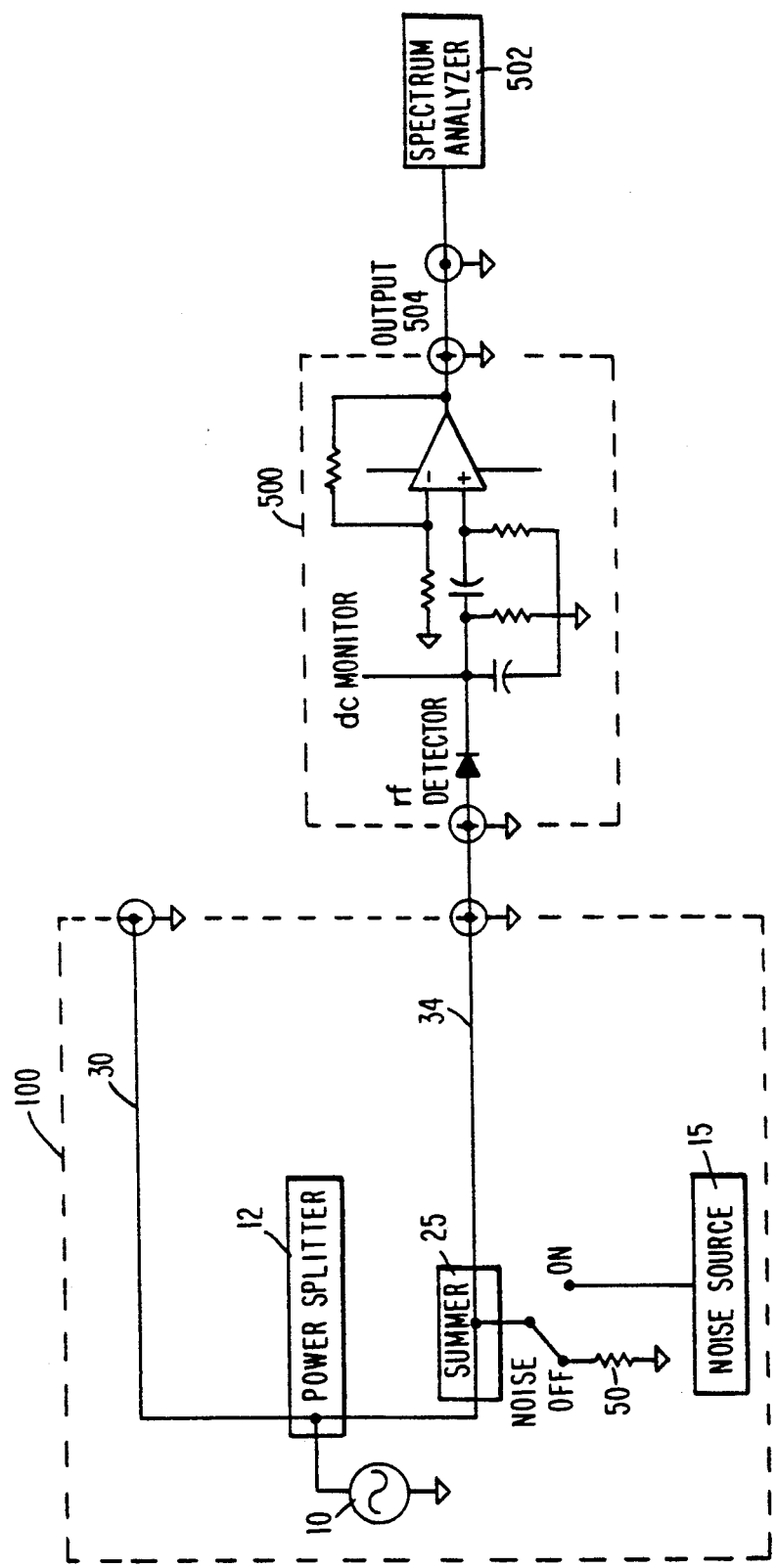
FIG. 5 is a block diagram of a simple amplitude modulation noise detection device connected to the noise standard.

The signal input of the AM noise measurement system to be measured 500 is connected to the output 34 of the PM/AM noise standard, as depicted in FIG. 5. The spectral density of AM noise is calculated as:

$$S_a(f) = (V_n(f)^2/BW (1/k_a(f))^2 \qquad (6)$$

where $V_n(f)^2/BW$ is the spectral density of voltage noise measured by the spectrum analyzer 502, and $k_a(f)$ is the sensitivity of the detector being tested (including any gain that may be associated with it). The AM noise detector 500 used is standard configuration well known in the noise detection art.

When the added differential noise is "ON", the measured level should agree with the results of Equation 5. The differences between the measured results and that determined from Equation 4 yield both the average error and the variation of $k_a(f)$ with Fourier frequency of the AM measurement system under test. This measurement is a very accurate method to determine $k_a(f)$ except at very low values of f where the AM noise of the source might mask the added noise. If this problem is important it can be solved by increasing the level of the added noise and decreasing the bandwidth to satisfy Equation 3.

Determining the variation of $k_a(f)$ with f is extremely difficult to determine by traditional methods since few sources can be accurately AM modulated over a broad range. This issue becomes even more serious as the carrier frequency increases.

The noise floor for AM measurements can be estimated by turning the differential added noise "OFF", measuring Vn(f), and computing $S_a(f)$ using Equation 5. The noise floor determined in this manner includes the true noise floor of the AM noise measurement system being calibrated and the AM noise of the internal oscillator of NIST PM/AM noise standard. In most cases, the noise floor of the NIST standard is lower than the detectors being tested.

Figure 7:
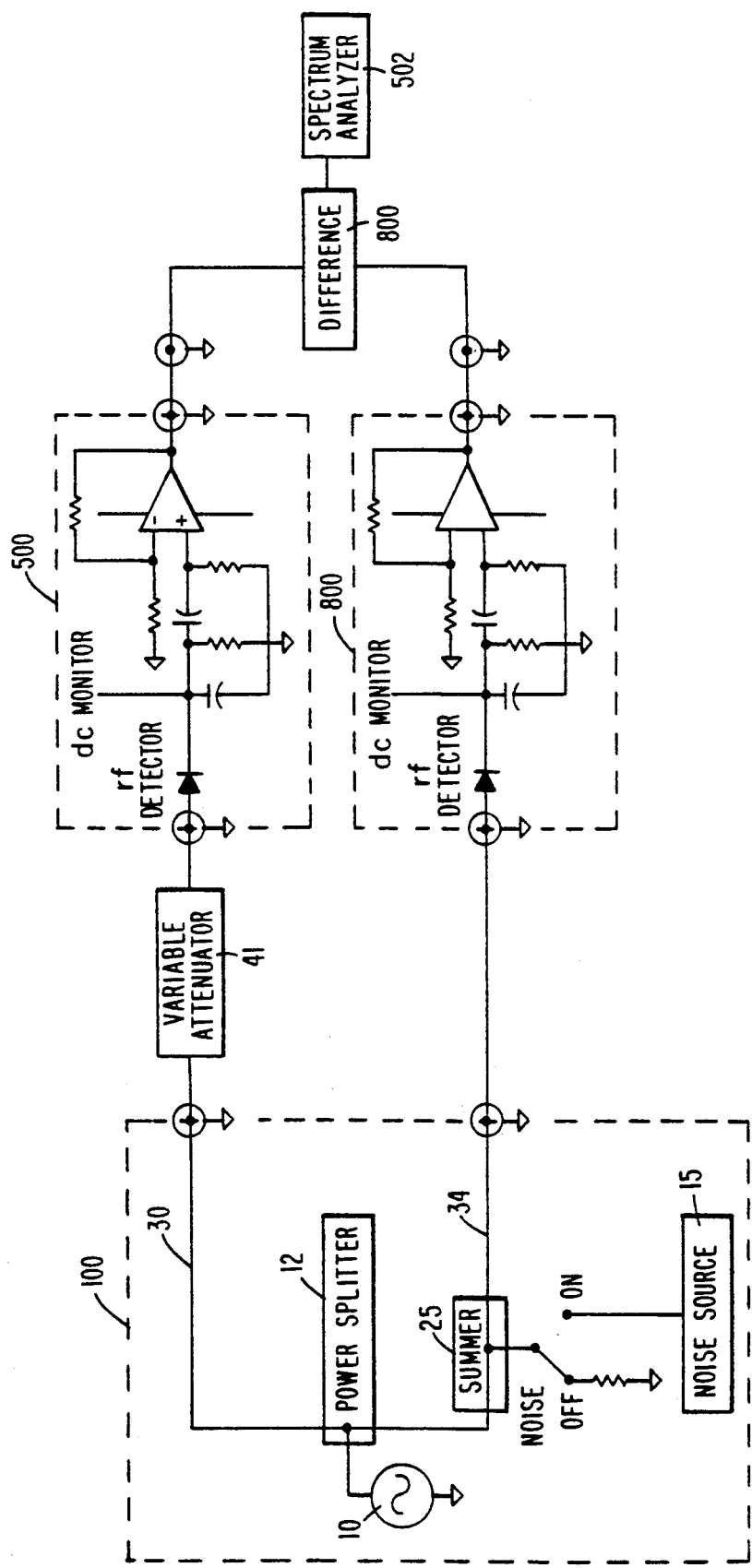
FIG. 7 is a block diagram of a differential AM noise detector configuration connected to a calibration standard.

In cases where the AM noise of the internal source 10 is so high as to make it difficult to evaluate the AM noise floor of a measurement system as described previously, the following differential technique can be used. This technique takes full advantage of the very low differential AM noise between outputs 30 and 34 of the PM/AM noise standard by using two similar detectors 500, 800 as depicted in FIG 7. The rf input of one detector 500 is connected to output 30 detector is connected to output 30 through a variable attenuator 41 and the rf input of the other detector is connected to output 34. The variable attenuator is adjusted to make the dc output levels of the detectors the same to within approximately 1%. The output of the two detectors (and associated amplifiers, if any, is then subtracted in a conventional device such as a differential amplifier 900 connected to a spectrum analyzer. Some spectrum analyzers also have a way to take the difference between the two input signals. With either of these methods, the AM noise of the internal source 10 would be greatly reduced, perhaps as much as 40 dB. (At very high Fourier frequencies it will be necessary to adjust the phase on the incoming signal to one of the AM detectors slightly to optimize the cancellation.) The noise floor measured in this manner is that of both detectors 500, 800 (and their associated amplifiers). If they were similar, one would subtract 3 dB from the measured result to obtain the noise floor of a single unit.

A more accurate value of the AM noise floor of the individual detectors (and amplifiers) requires that measurements can be made on three detectors with all combinations (detectors 1-2, 1-3 and 2-3). The determination of $S_a(f)$ of unit 1 is:

$$S_a^1(f) = \frac{1}{2}(S_a^{1-2}(f) + S_a^{1-3}(f) = S_a^{2-3}(f)) \quad (7)$$

since the random noise in the detectors is uncorrelated.

The variation of $k_a(f)$ of this differential AM noise measurement system is determined by turning the added differential noise (from source 15) "ON", measuring $V_n(f)$, and comparing the results obtained from Equation 6 with that obtained from Equation 2.

The use of the PM/AM noise standard in the manner prescribed above would calibrate all of the errors of the measurement even at very low value of f where the AM noise of the internal source might swamp the noise floor of the measurement system under test or the added differential noise if one used the technique described with respect to FIG. 5.

Figure 6:
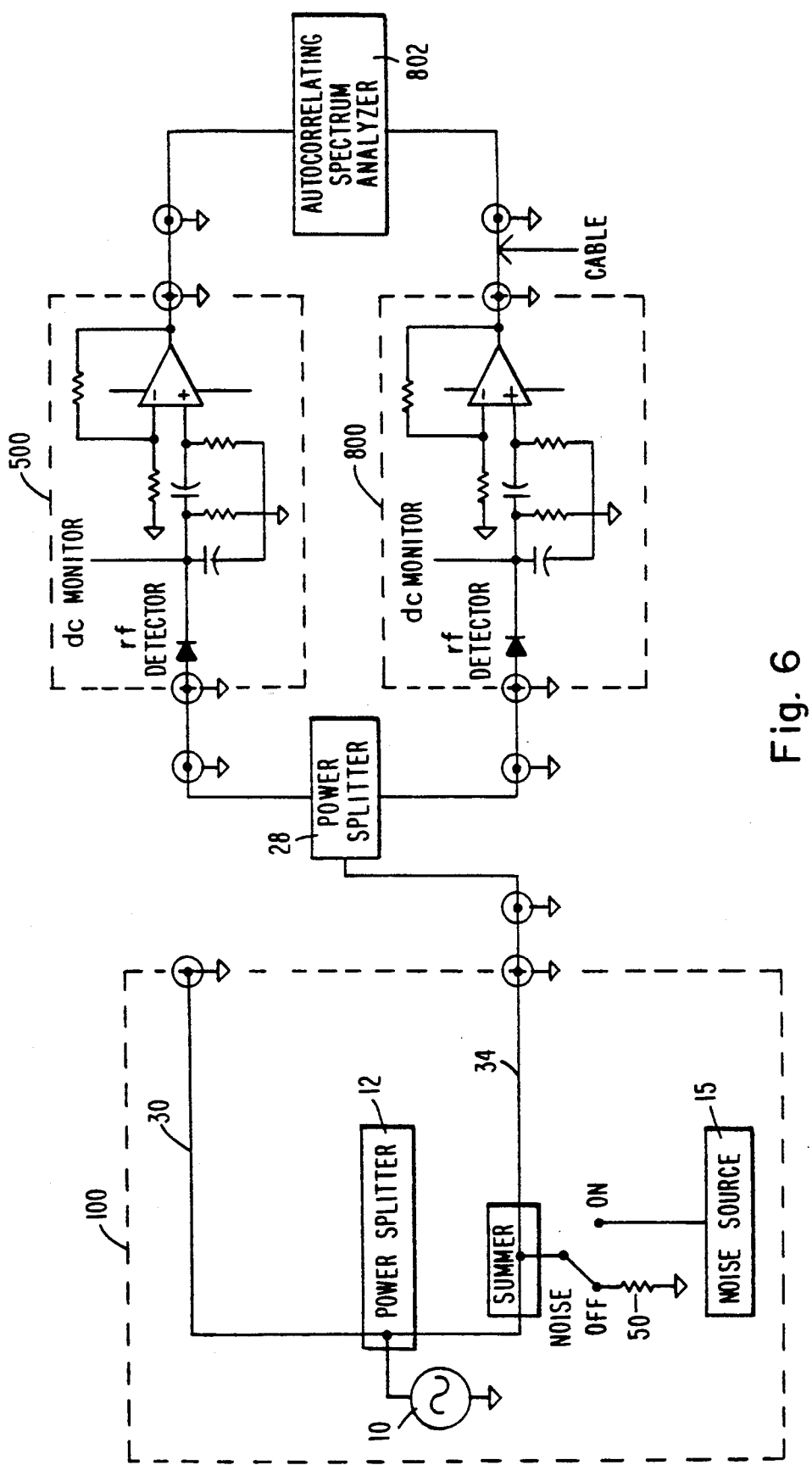
FIG. 6 is a block diagram of an AM noise detector configuration using an autocorrelation spectrum analyzer and connected to a calibration standard.

The purpose of an autocorrelation approach as depicted in FIG. 6 is to produce an AM detector that has an extremely low AM noise floor. If the output from the two similar AM detectors 500, 800 was analyzed in a spectrum analyzer 802 that used autocorrelation techniques to determine the level of noise that was common between the two outputs, the uncorrelated noise in the two detectors and their associated amplifiers would cancel out to a high degree. $S_a(f)$ is determined by turning the added differential noise "ON", measuring $V_n(f)$ with the autocorrelating spectrum analyzer, and computing $S_a(f)$ using Equation 6.

The PM/AM noise standard used in the prescribed manner prescribed above would also calibrate all of the errors including the error versus f, except at very low values of f where the noise of the internal source might swamp the added noise. Again one can counter this by making the added noise somewhat higher in level and narrower in bandwidth as described above or by using two detector systems as previously described.

A typical method of determining $k_a(f)$ prior to measuring AM noise is described below using FIG. 5. First, output 34 of the PM/AM noise standard is connected to detector and the detected dc level noted. Second, the output of an auxiliary source (not shown) that can be amplitude modulated at a known level is connected to the detector 500 and the rf level, impedance 50, and the frequency adjusted to that chosen for the PM/AM noise standard. The auxiliary AM source is then AM modulated at a convenient frequency and level. For example, 1% modulation at 1 KHz. The level of the signal modulation signal from the short labeled "OUTPUT" 504 in FIG. 5 is then recorded as "AM REF LEVEL". The detector sensitivity multiplied by the gain of the amplifier is then found from:

$$(k_a G(f))^2 = (\text{AM REF LEVEL})^2 / \frac{1}{2}(\%AM/100)^2 \quad (8)$$

In general, the AM REF LEVEL is a function of the modulation frequency f.

Third, the AM noise detector 500 is then reconnected to output 34 of the PM/AM noise standard, the added differential noise is turned "ON", and the signal from "OUTPUT" is analyzed in a spectrum analyzer 502. The spectral density of AM noise is calculated as:

$$S_a(f) = V_n(f)^2 / BW \, (\frac{1}{2}(\%AM/100)^2 / (\text{AM REF LEVEL})^2 \quad (9)$$

Measurement of frequency stability in the time-domain is another common method used to characterize the frequency stability of oscillators and other components, as discussed in publications 1-4 in the attached Appendix. Time-domain measurements are those of the fractional frequency stability measured as a function of the measuring time. The most commonly used measure is the Allan deviation defined on page TN-25 of publication 3 in the attached Appendix. Previously there has not been a method to calibrate the accuracy of time-domain measurement systems because the measured time-domain frequency stability depends on the measurement bandwidth, the averaging time, and the type of phase noise. The calibration standard of the present invention provides a differential level of PM noise that is constant in amplitude for measurement bandwidths from 1 Hz to 10% of the carrier. Under these conditions the fractional frequency stability between outputs 30 and 34, as characterized by the square root of Allan variance (described in publication 4 of the Appendix) is given by $$\sigma_y(\tau) = \frac{\sqrt{3F_h S\phi(f)}}{2\pi \nu_0 \tau}, \qquad (10)$$

where $f_h$ is the measurement bandwidth and $\tau$ is the measurement time. When a time-domain frequency stability measurement system is connected between outputs 30 and 34 $\sigma_y(\gamma)$ should vary as $\tau^{-1}$ for measurement times from approximately 0.1 us to 0.5 s. Comparing the results with Equation 10 yields the measurement bandwidth, since $S\phi(f)$ is known. The noise floor of time-domain measurement system can be evaluated by turned the added PM noise "off". Measurement systems that require a beat frequency between the two signals can be evaluated by connecting one port to output 34 and connecting the other port to a low phase noise source tuned for the appropriate beat frequency. In this case, Equation 10 would be valid over a narrower range of measurement times depending on the noise level of source 10 and the second source. The calibration standard of the present invention provides for a white phase noise and a wide variety of measurement bandwidths and times (approximately microseconds to many seconds) since the phase noise level is calibrated and is constant from approximately the DC level to 5-10% of the carrier frequency up to a maximum of one GHz. Since the phase noise generated by Gaussian source 15 can be turned on and off, the noise floor of time-domain measurement systems over a variety of measurement times (microseconds to seconds) can be determined.

It is noted that if the frequencies generated by high frequency generating means 10 are multiplied into the GHz range, for example, 42.4 GHz, the phase noise between the two output terminals is exceptionally low when the noise from source 15 is off and it is $4^2 = 16$ times the phase noise at 10.6 GHz when the noise from source 15 is on.

Figure 8:
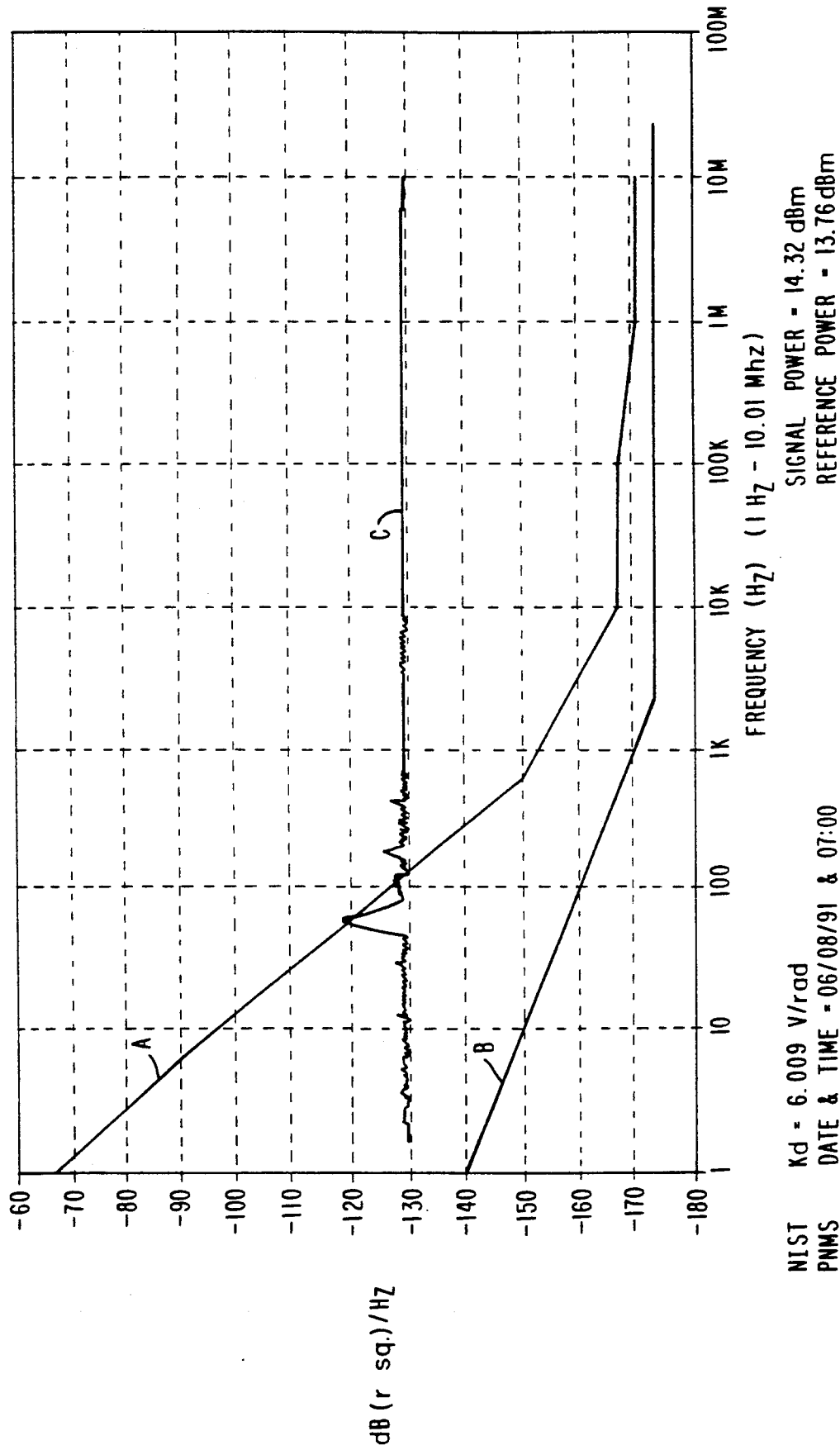
FIG. 8 is a set of curves illustrating the measurement results for the calibration standard of the present invention at 100 MHz.

Operating characteristics of the calibration standard of the present invention are shown in FIGS. 8. Curve A shows the PM noise of the 100 MHz reference oscillator. Curve B shows the noise floor of the calibration standard at 100 MHz using the arrangement of FIG. 2 when switch 21 has disconnected the calibrated noise source. The level of PM noise between terminals 30 and 34 at 100 MHz is shown in curve C. The cancellation of the noise of the 100 MHz reference oscillator using the arrangement of FIG. 2 (the difference between curves A and B) reaches approximately 73 dB at 1 Hz. The large suppression of the reference oscillator PM noise makes it possible to use a calibration standard of the present invention over a much larger range of Fourier frequencies than known techniques which are sensitive to the PM noise of the reference, such as those shown in FIGS. 3 and 4. At 100 MHz, the difference is having an accurate PM standard for Fourier frequency offsets from 1 Hz to 10 MHz versus 300 Hz to 10 MHz. The peaks at 60, 120 and 180 Hz in curve B are due to spurious signals originating from the power lines.

Figure 9:
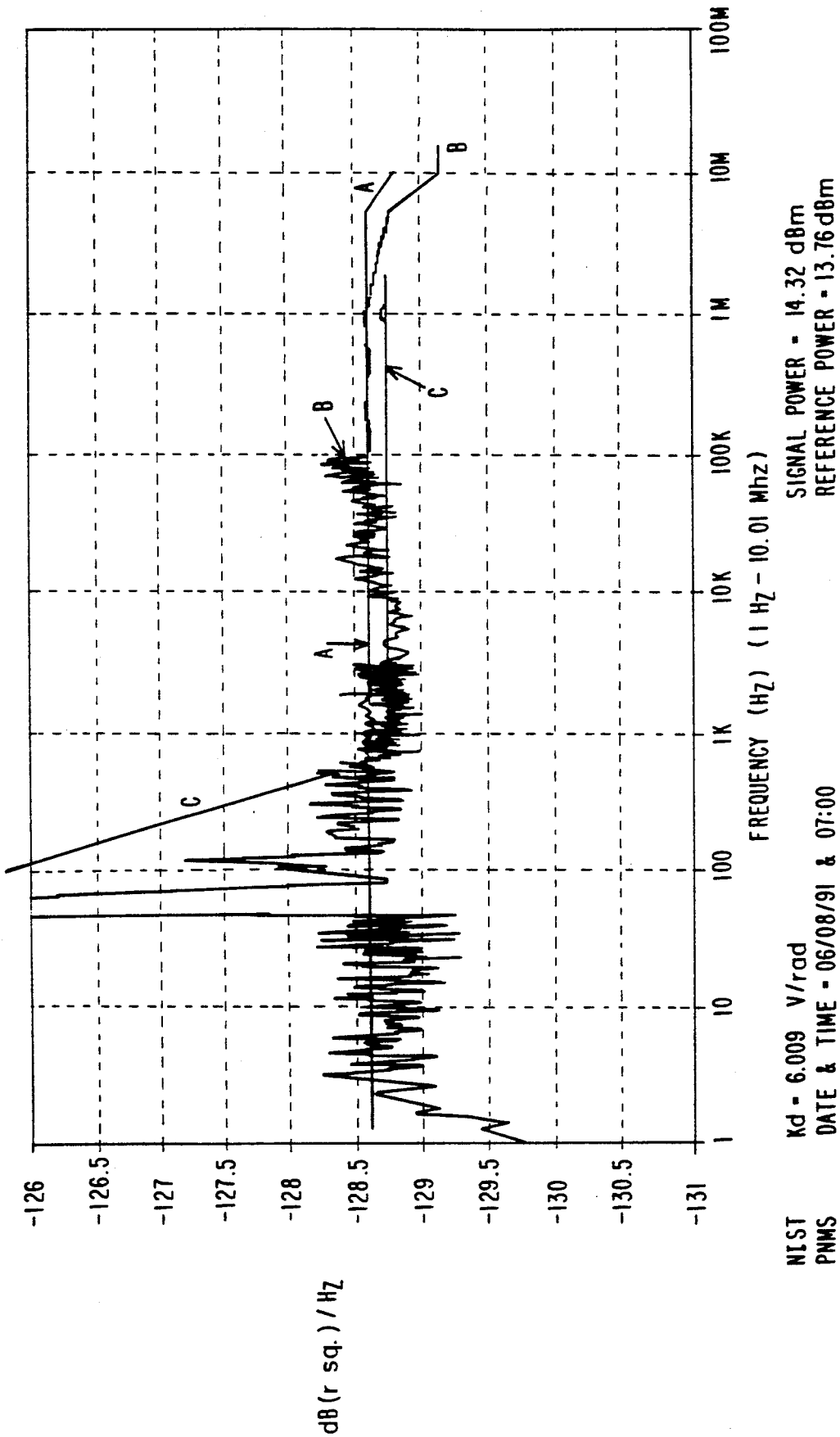
FIG. 9 is a set of curves illustrating the measurement results for the calibration standard of the present invention at a carrier frequency of 100 MHz.
Figure 2:
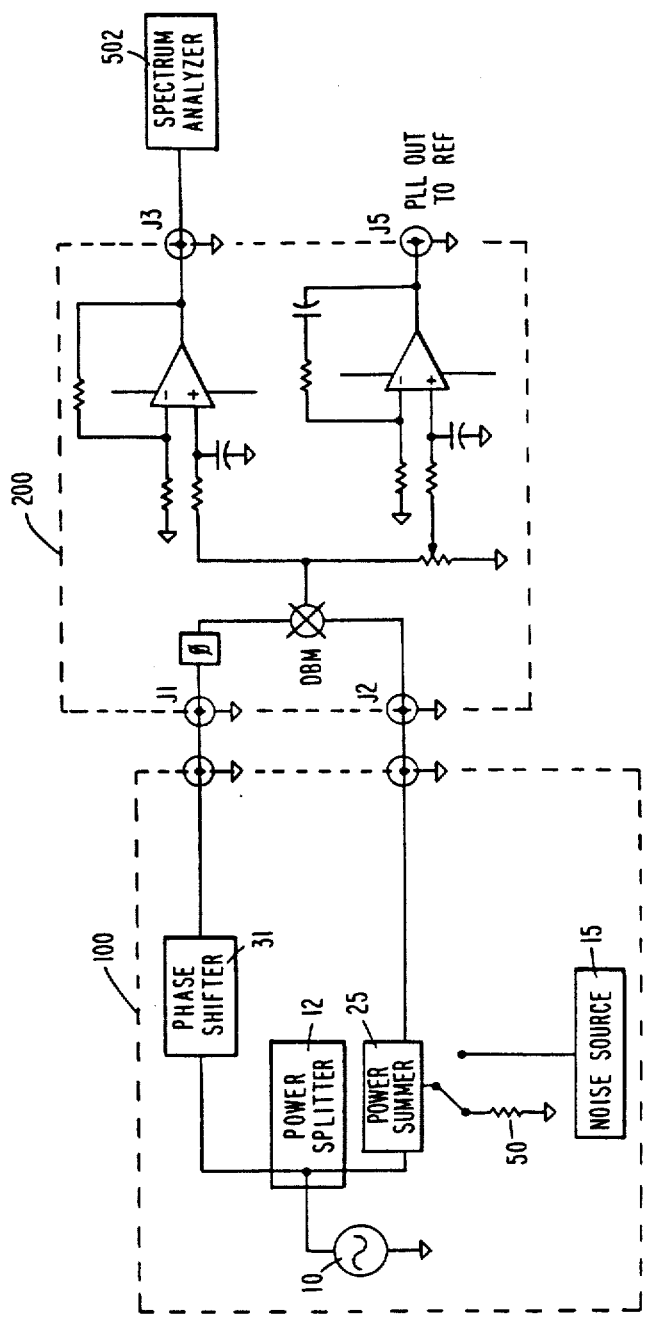
Figure 3:
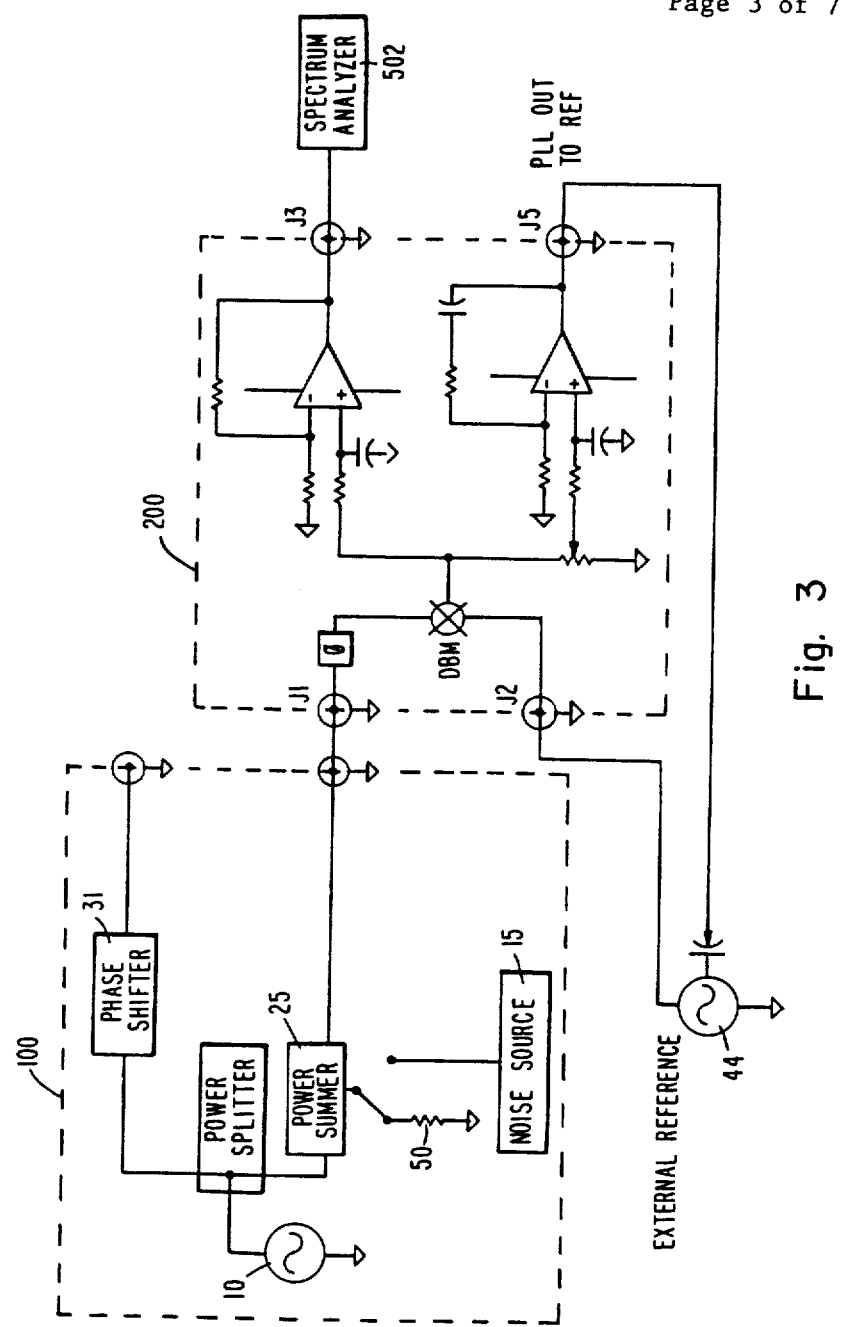
Figure 4:
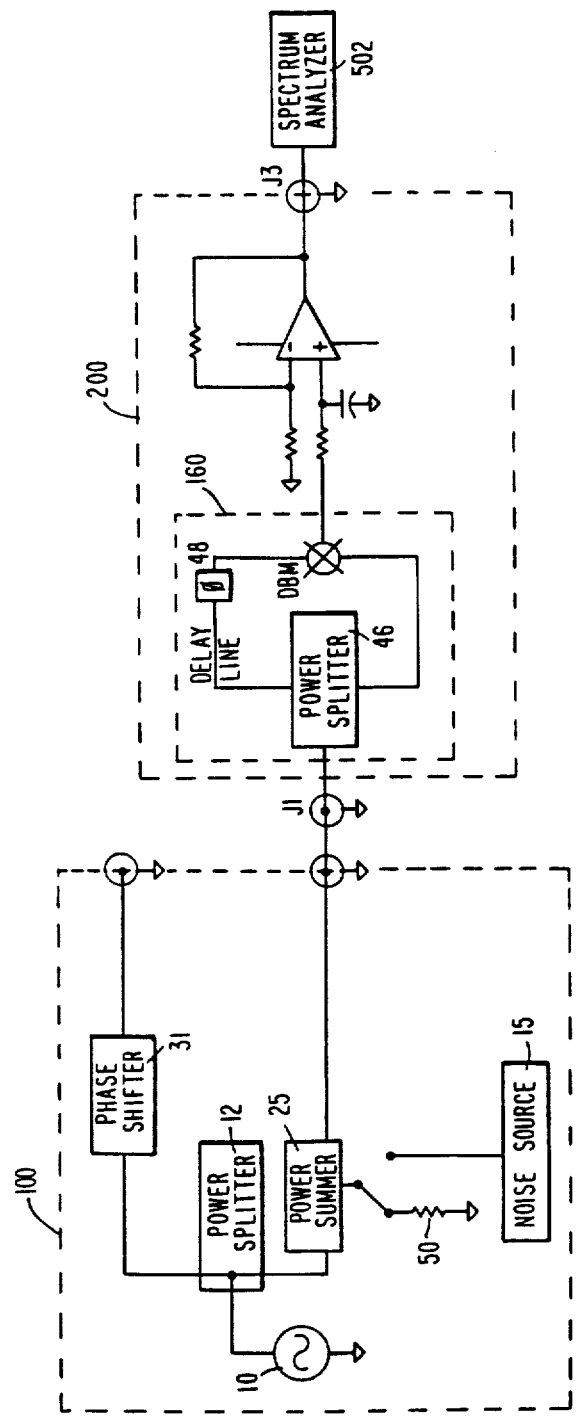
Figure 5:
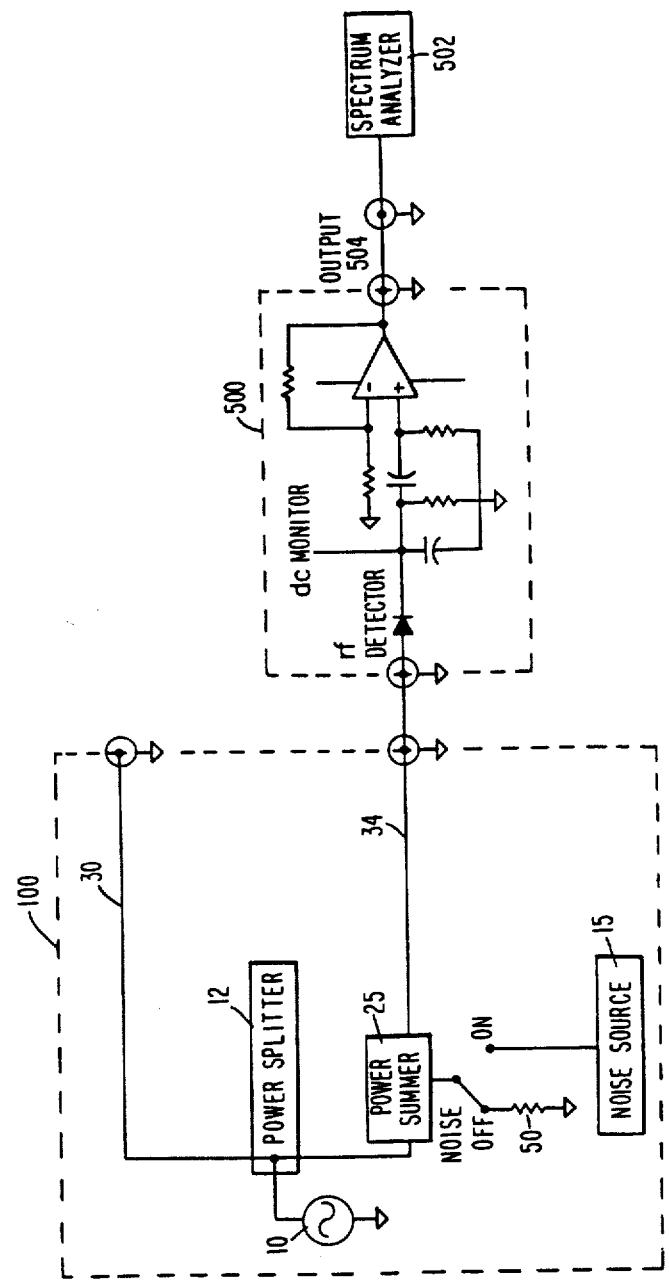
Figure 6:
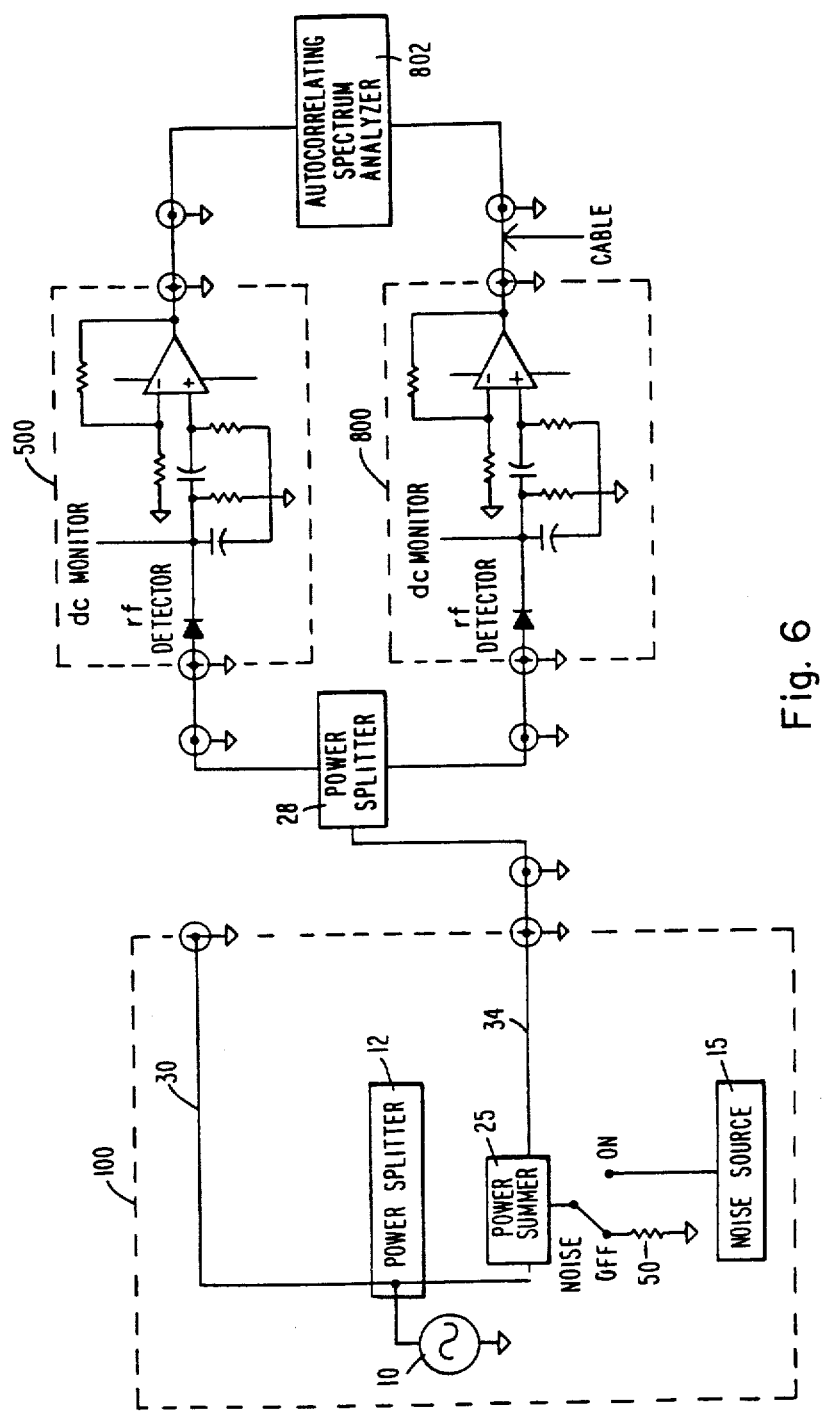
Figure 7:
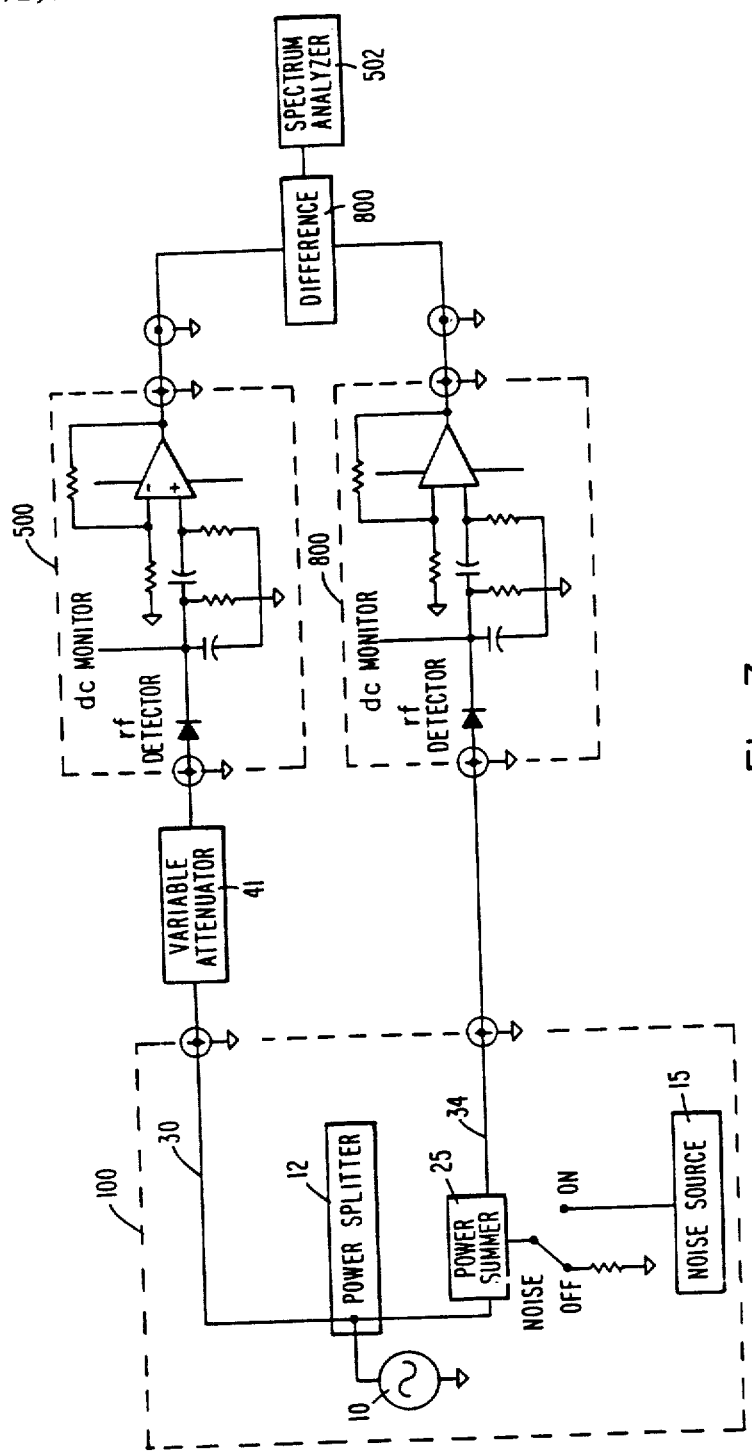

FIG. 9 includes curves showing the characteristics measured from the calibration standard of the present invention in conjunction with a noise measurement apparatus. Curve A shows the level of the PM noise in the calibration standard at 100 MHz determined using a high dynamic range noise detection apparatus in the calibration mode. Curve B shows the measurement of the PM noise level using the phase noise measurement system described in U.S. Pat. No. 4,968,908. Curve C shows the level of AM noise determined using the apparatus illustrated in FIG. 5. The divergence of curve C from curves A and B for Fourier frequencies below 300 Hz is easily shown by the AM noise floor measurements (when switch 21 disconnects the Gaussian noise from source 15) to be due to noise in the diode detector used to make these measurements. The diode detector is an inexpensive device, having relatively high residual noise. Fluctuations in curve B versus frequency are primarily due to the finite number of samples taken to estimate the spectral density. These limitations are discussed in publication 8 of the attached Appendix. The differences between curves A and B are consistent with the estimated errors in the internal phase modulator used in the calibration in the phase measurement device of U.S. Pat. No. 4,968,908.

Similar performance for both PM and AM noise is obtained at 5 and 10 MHz. The techniques illustrated herein can be extended to high frequencies and to higher accuracies, for example, 10.6 GHz for Fourier frequencies out to 400 MHz, using presently available technology. The PM/AM noise of the calibration standard of the present invention has remained constant to within ±0.3 dB for over a year. The level of PM noise in the calibration standard has been evaluated for Fourier frequencies from 1 Hz up to 10% of the carrier to an accuracy of ±0.2 dB. The amplitude noise $S_a(f)$ is equal to $S_\phi(f)$ over a very wide range of Fourier frequencies to an accuracy of approximately ±0.2 dB.

Although a number of the arrangements of the invention have been mentioned by way of example, it is not intended that the invention be limited thereto. Accordingly, the invention should be considered to include a number of processes for using a calibration standard and any and all configurations, modifications, variations, combinations or equivalent arrangements falling within the scope of the following claims.

APPENDIX

1. J. A. Barnes A. R. Chi L. S. Cutler, D. J. Healey, D. B. Leeson, T. E. McGunigal, J. A. Mullen, Jr., W. L. Smith, R. L. Sydnor, R. F. C. Vessot, and G. M. R. Winkler, Characterization of Frequency Stability, IEEE Transactions on Instrumentation and Measurement, IM-20, 105-120 (1971).

2. D. W. Allan, H. Hellwig, P. Kartaschoff, J. Vanier, J. Vig. G. M. R. Winkler, and N. Yannoni, Standard Terminology for Fundamental Frequency and Time Metrology, Proc. of 42nd Annual Symposium on Frequency Control, Baltimore, Md., Jun. 1-4, 1988, pp. 419-425.

3. D. A. Howe, D. W. Allan, and J. A. Barnes, Properties of Signal Sources and Measurement Methods, Proc. of 35th Annual Symposium on Frequency Control, Philadelphia, Pa., May 27-29, 1981, pp. A-1(669)-A47.

4. Characterization of clocks and Oscillators, Eds. D. B. Sullivan, D. W. Allan, D. A. Howe, and F. L. Walls, NIST Tech. Note 1337, 1990.

5. F. L. Walls, A. J. D. Clements, C. M. Felton, M. A. Lombardi and M. D. Vanek, Extending the Range and Accuracy of Phase Noise Measurements, Proc. of 42nd Annual Symposium on Frequency Control, Baltimore, Md., Jun. 1–4, 1988, pp. 279–283.

6. F. L. Walls, C. M. Felton, A. J. D. Clements, and T. D. Martin, Accuracy Model for Phase Noise Measurements, Proc. of 21st Annual Precise Time and Time Interval Planning Meeting, Redondo Beach, Calif., Nov. 30–Dec. 1, 1990, pp. 295–310; F. L. Walls, A. J. D. Clements, C. M. Felton, and T. D. Martin, Precision Phase Noise Metrology, submitted to Proc. of National Conference of Standards Laboratories, Aug. 1991.

7. F. L. Walls and A. DeMarchi, RF Spectrum of a Signal after Frequency Multiplication; Measurement and Comparison with a Simple, Calculation, IEEE Transactions on Instrumentation and Measurement, IM-24, 210–217 (1975).

8. F. L. Walls, D. B. Percival, and W. R. Irelan, Biases and Variances of Several FET Spectral Estimators as a Function of Noise Type and Number of Samples, Proc. of 43rd Annual Symposium on Frequency Control, Denver, Colo., May 31–Jun. 2, 1989, pp. 336–341.

9. F. L. Walls, J. Gary A. O'Gallagher, L. Sweet, and R. Sweet, Time-Domain Frequency Stability Calculated from the Frequency Domain: An Update, Proc. of 4th European Frequency and Time Forum, Neichatel, Switzerland, Mar. 13–15, 1990, pp. 197–204; J. Gary, A. O'Gallagher, L. Sweet, R. Sweet, and F. L. Walls, Time Domain Frequency Stability Calculated from the Frequency Domain Description: Use of the SIGINT Software Package to Calculate Time Domain Frequency Stability from the Frequency Domain, NISTIR 89-3916, 1989.

10. F. L. Walls, "Method and Apparatus for Wide Band Phase Modulation" Patent #4,968,908 issued Nov. 6, 1990.

I claim:

1. Calibration standard for determining inherent phase modulation and amplitude modulation noise of an associated noise measurement device, comprising:
   means for generating high frequency signals;
   means for generating precision broad band noise;
   dual output terminals for connecting a differential output to associated noise measurement devices;
   power splitter means for providing said high frequency signals to both said differential output terminals;
   power summer means for combining one output of said power splitter means and one output of said noise generating means; and
   means for selectively switching between potentials, operatively connected between said noise generating means and said power summer means to selectively provide two noise levels to said associated noise measurement device.

2. The calibration standard of claim 1, wherein said means for generating high frequency signals comprises a plurality of high frequency generators an amplifier and a selector switch.

3. The calibration standard of claim 2, wherein said plurality of high frequency generators has a range of 1 KHz–$10^{10}$ Hz.

4. The apparatus of claim 1, wherein said noise generating means comprises:
   a precision broad band Gaussian noise source; a plurality of filters;
   a selection switch;
   a plurality of attenuators; and
   a plurality of amplifiers.

5. The calibration standard of claim 1, wherein said means for switching is operatively connected between said noise generating means and said power summer to selectively switch between an output of said noise generating means and a grounded characteristic impedance of the power summer, wherein floor noise is determined when said means for switching connects said grounded characteristic impedance to said power summer.

6. A calibration standard for measuring inherent phase modulation and amplitude modulation noise of an associated noise measurement device, said calibration standard comprising:
   means for generating high frequency signals;
   means for generating noise;
   dual output terminals for connecting to said associated noise measurement device;
   power splitter means;
   power summer means;
   means for switching,
   wherein phase modulation and amplitude modulation noise generated in said calibration standard are equal to each other at one of said dual output terminals and spectral density of differential phase modulation noise, and spectral density of differential amplitude modulation noise between said dual output terminals are equal.

7. The calibration standard of claim 6 wherein said calibration standard outputs an integrated phase noise between $10^{-1}$ and $10^{-4}$ rad$^2$.

8. The calibration standard of claim 6, wherein said spectral density of differential noise for phase modulation and amplitude modulation noise is equal to each other within an accuracy of $\pm 0.2$ dB.

9. The calibration standard of claim 6, wherein PM noise provided by said means for generating noise is much greater than AM noise from said means for generating high frequency signals.

10. A method for deriving a correction factor for an AM/PM noise measurement system being tested by a calibration standard, said method comprising the steps of:
   (a) measuring a noise floor of said calibration standard when a high frequency signal is generated by said calibration standard;
   (b) combining a high frequency signal and a Gaussian noise signal in a power summer to measure combined noise of said calibration standard at a differential output of said calibration standard wherein PM and AM noise components are equal;
   (c) determining spectral density of noise of said calibration standard from said floor noise of said calibration standard and said combined noise of said calibration standard;
   (d) connecting said calibration standard to a noise measurement system being tested thereby forming a combined system;
   (e) measuring floor noise for the combined system by generating a high frequency signal in said calibration standard;
   (f) combining a high frequency signal and a Gaussian noise signal in said power summer to measure combined noise of said combined system;
   (g) determining spectral density of noise of said combined system from said floor noise of said combined system and said combined noise of said combined system;
   (h) determining a correction factor from a comparison of said spectral density of noise of said calibration standard and said spectral density of noise of said combined system.

* * * * *

UNITED STATES PATENT AND TRADEMARK OFFICE
CERTIFICATE OF CORRECTION

PATENT NO. : 5,172,064

DATED : December 15, 1992

INVENTOR(S) : Fred L. Walls

It is certified that error appears in the above-identified patent and that said Letters Patent is hereby corrected as shown below:

The drawing sheets, consisting of Figs. 2-7, should be deleted to be replaced with the drawing sheets, consisting of Figs. 2-7, as shown on the attached page.

Col. 5, line 45, change "the two" to --to--

Col. 6, line 52, change "airs" to --errors--

Signed and Sealed this

Eighteenth Day of January, 1994

Attest:

BRUCE LEHMAN

*Attesting Officer*     *Commissioner of Patents and Trademarks*